United States Patent
Nasu

[11] Patent Number: 6,124,747
[45] Date of Patent: Sep. 26, 2000

[54] OUTPUT BUFFER CIRCUIT CAPABLE OF CONTROLLING THROUGH RATE

[75] Inventor: Koji Nasu, Tokyo, Japan

[73] Assignee: Mitsubishi Denki Kabushiki Kaisha, Tokyo, Japan

[21] Appl. No.: 09/159,546

[22] Filed: Sep. 24, 1998

[30] Foreign Application Priority Data

Apr. 24, 1998 [JP] Japan ................... 10-115681

[51] Int. Cl.[7] .................... H03K 17/16; H03K 19/003
[52] U.S. Cl. .................... 327/281; 327/112; 327/391; 326/86; 326/87
[58] Field of Search ................... 327/278, 279, 327/281, 276, 112, 384, 387, 389, 391; 326/87, 86, 83, 30

[56] References Cited

U.S. PATENT DOCUMENTS

| | | | |
|---|---|---|---|
| 4,829,199 | 5/1989 | Prater | 326/27 |
| 5,122,690 | 6/1992 | Bianchi | 326/27 |
| 5,134,311 | 7/1992 | Biber et al. | 327/108 |
| 5,332,932 | 7/1994 | Runaldue | 326/33 |
| 5,528,166 | 6/1996 | Iikbahar | 326/27 |

FOREIGN PATENT DOCUMENTS

0 678 983  10/1995  European Pat. Off. ..... H03K 19/003

*Primary Examiner*—Timothy P. Callahan
*Assistant Examiner*—Terry L. Englund
*Attorney, Agent, or Firm*—Burns, Doane, Swecker & Mathis, LLP

[57] ABSTRACT

An output buffer circuit capable of controlling a through rate at a constant rate. Each decision circuit of a plurality of decision circuits (11–13, 18–20) receives a voltage potential from an output terminal (10) and compares it with a respective predetermined voltage value. Flip flops (15–17) with an asynchronous set function or flip flops (22–24) with an asynchronous reset function receive respective comparison results as decision results when receiving a respective trigger signal from a respective delay circuit from a plurality of delay circuits (14, 21) after the elapse of a respective predetermined time period from a time at which an input terminal (1) receives a H level control signal or an L level control signal. The flip flops (15–17 and 22–24) control the operation of output transistors (3–5 and 7–9) based on the respective decision results.

11 Claims, 5 Drawing Sheets

OUTPUT BUFFER CIRCUIT CAPABLE OF CONTROLLING THROUGH RATE

BACKGROUND OF THE INVENTION

1. Field of the Invention

The present invention relates to an output buffer circuit capable of controlling the through rate of a wave form of an output voltage to be provided to external devices connected to an output terminal of the output buffer circuit.

2. Description of the Prior Art

Figure 5:
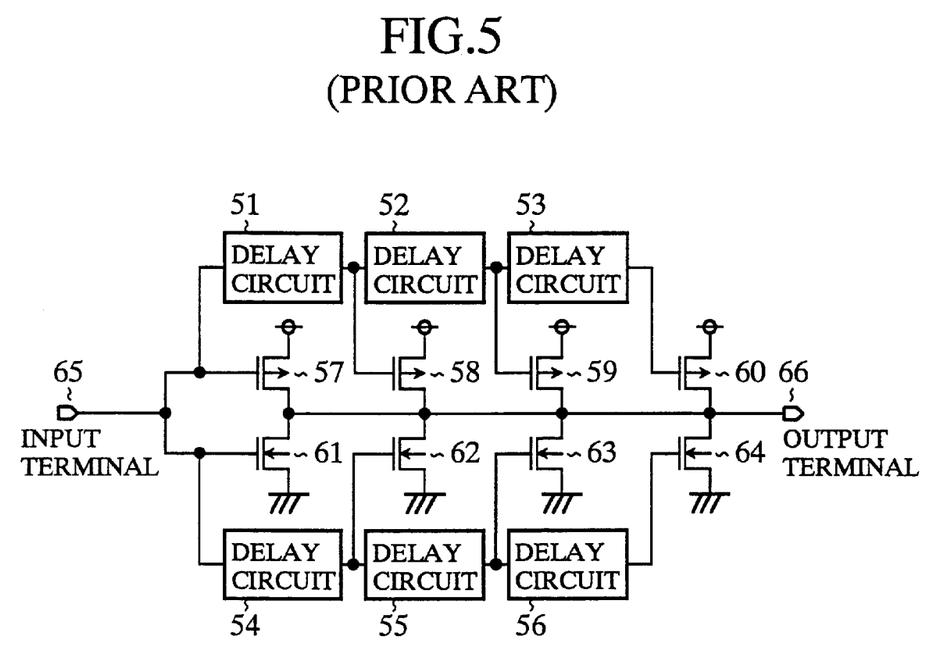
FIG. 5 is a block diagram showing a configuration of the conventional output buffer circuit.

FIG. 5 is a block diagram showing a configuration of a conventional output buffer circuit capable of controlling through rate of a wave form of an output voltage (hereinafter referred to as "an output wave form") to be provided to external devices (not shown) connected to an output terminal 66 of the output buffer circuit. In FIG. 5, the reference number 65 designates an input terminal. The reference numbers 57 to 60 denote output transistors for outputting a high voltage level (a H voltage level). The reference numbers 61 to 64 denote output transistors for outputting a low voltage level (a L voltage level). The reference numbers 51 to 56 indicate delay circuits, and 66 designates an output terminal.

Next, a description will be given of the operation of the conventional output buffer circuit and drawbacks thereof having the configuration described above.

In the basic operation of the conventional output buffer circuit shown in FIG. 5, the through rate of an output wave form of an output voltage provided through the output terminal 66 to external devices (omitted from FIG. 5) in the conventional output buffer circuit may be controlled by switching the H level output transistors 57 to 60 and the L level output transistors 61 to 64 into ON state based on a time difference among time values that have been set in advance in the delay circuits 51 to 56, respectively. However, this configuration has a drawback in which the through rate of the output wave form of an output voltage provided through the output terminal 66 is changed according to the magnitude of a total load capacity of the external devices connected to the output terminal 66 because each of the output transistors 58 to 60 and 62 to 64 operates based on the fixed delay time that has been set in advance in each of the delay circuits 51 to 56. Therefore the through rate of the wave form of the output voltage is changed according to the change of the magnitude of the total load capacity of the devices.

Figure 4:
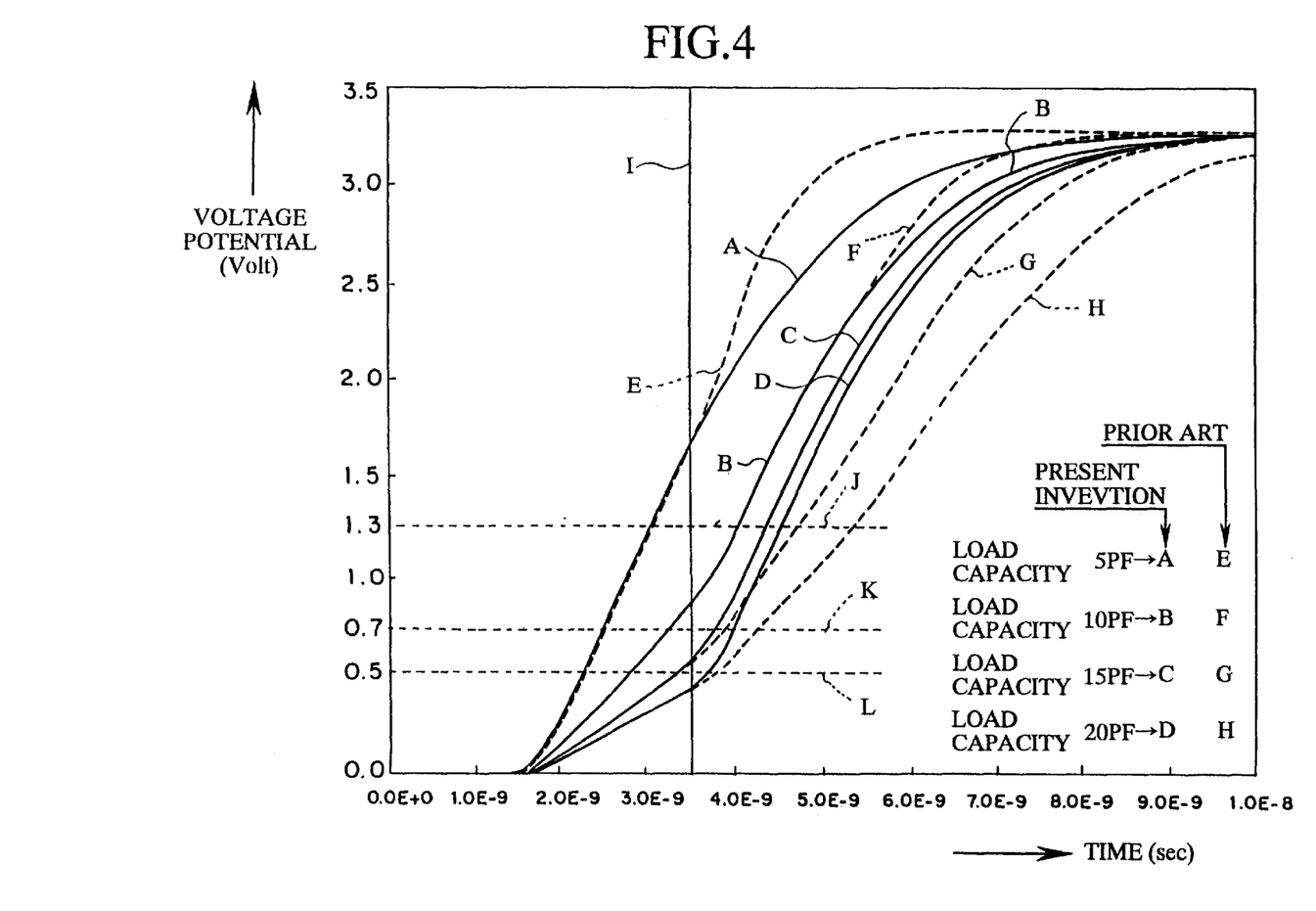
FIG. 4 is a diagram showing the comparison results of wave forms of output voltages provided from the output buffer circuit of the first to third embodiments shown in FIGS. 1 to 3 and from a conventional output buffer circuit shown in FIG. 5.

FIG. 4 is a diagram showing various wave forms of output voltages provided from the conventional output buffer circuit designated by the dotted lines E to H and from an improved output buffer circuit as the present invention designated by the solid lines. The feature of the output buffer circuit according to the present invention indicated by the solid lines A to D will be explained in the following section, namely, "DETAILED DESCRIPTION OF THE PREFERRED EMBODIMENT".

In FIG. 4, the dotted lines E to H indicate the output waves forms of the various output voltages provided from the conventional output buffer circuit. In FIG. 4, the horizontal axis indicates time (nano seconds) and the vertical axis denotes a voltage (Volts). The dotted lines in FIG. 4 show the changes of the through rate of the output wave form provided from the conventional output buffer circuit caused by the change of the magnitude of the load capacity of the external devices connected to the output terminal 66. As shown in FIG. 4, the output wave form E shows the case when the magnitude of the load capacity is g 5 pF, the output wave form F indicates the case of 10 pF, the output wave form G indicates the case of 15 pF, and the output wave form H indicates the case of 20 pF.

In the conventional output buffer circuit, because each of the transistors 58 to 60 and 62 to 64 turns ON based on the fixed delay time even if the change of a transistor characteristic of each of the output transistors 58 to 60 and 62 to 64 is caused by the fluctuation of ambient temperature, there is a drawback that the through rate of the output wave form of the output voltage is changed according to the change of the transistor characteristic caused by the fluctuation of ambient temperature.

SUMMARY OF THE INVENTION

Accordingly, an object of the present invention is, with due consideration to the drawbacks of the conventional technique, to provide an output buffer circuit capable of controlling the through rate of an output wave form of an output voltage provided from the output buffer circuit at a constant value by controlling ON/OFF operations of output transistors incorporated in the output buffer circuit corresponding to the change of the transistor characteristic of the output transistors to be caused by the fluctuation of the total load capacity of external devices connected to an output terminal of this output buffer circuit and also to be caused by the fluctuation of the ambient temperature, based on information or data about the voltage potential at the output terminal.

In accordance with a preferred embodiment of the present invention, an output buffer circuit capable of controlling a through rate of an output wave form of an output voltage provided from an output terminal at a constant rate, comprises a plurality of voltage potential decision means, each voltage potential decision means for inputting information about a voltage potential at said output terminal, for comparing said voltage potential with a predetermined standard value, and for outputting a decision result, a plurality of delay means, each delay means for outputting a trigger signal after a predetermined time period is elapsed counted from when an input terminal receives a control signal, a plurality of output means for providing an output voltage to said output terminal; and a plurality of control means for inputting said decision results from said plurality of voltage potential decision means and for operating said plurality of output means according to said decision results when said plurality of control means receive said trigger signal transferred from said plurality of delay means. Thereby, the output buffer circuit may keep the through rate at a constant rate even if the total load capacity of external devices connected to the output terminal is changed and in spite of the change of transistor characteristics of said plurality of output means caused by the fluctuation of ambient temperature.

In the output buffer circuit capable of controlling a through rate as another preferred embodiment, said plurality of output means comprises a plurality of H level voltage output transistors and a plurality of L level voltage output transistors, said plurality of voltage potential decision means comprises a plurality of voltage decision circuits for H level output voltage and a plurality of voltage decision circuits for L level output voltage, said control means comprises a plurality of flip flop circuits with asynchronous set function and a plurality of flip flop circuits with asynchronous reset function, said plurality of delay means comprises a signal delay circuit for the H level output voltage and a signal delay circuit for the L level output voltage, and wherein said plurality of H level voltage output transistors output the output wave form of the H level output voltage according to the operation of said plurality of voltage potential decision circuits for the H level output voltage, said plurality of flip flop circuits with asynchronous set function and said delay circuit for the H level output voltage, and wherein said plurality of L level voltage output transistors output the output wave form of the L level output voltage according to the operation of said plurality of voltage potential decision circuits for the L level output voltage, said plurality of flip flop circuits with asynchronous reset function and said delay circuit for the L level output voltage.

In the output buffer circuit capable of controlling a through rate as another preferred embodiment, the output buffer further comprises switching means for selecting one of the plurality of output means, said plurality of control means input said decision results from said plurality of voltage potential decision means when said plurality of control means receive said trigger signal from said plurality of delay means and said plurality of control means input said decision results from said plurality of voltage potential decision means when said input terminal inputs said control signal.

In the output buffer circuit capable of controlling a through rate as another preferred embodiment, the output buffer circuit further comprises a plurality of storing means for temporarily storing said plurality of decision results from said plurality of voltage potential decision means, and wherein said plurality of control means control said operation of said plurality of output means based on said plurality of decision results stored in said plurality of storing means.

In the output buffer circuit capable of controlling a through rate as another preferred embodiment, said switching means comprises selectors.

In the output buffer circuit capable of controlling a through rate as another preferred embodiment, said storing means comprises registers.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the output buffer circuit capable of controlling a through rate according to the present invention will now be described with reference to the drawings. This output buffer circuit of the present invention may control the through rate of a wave form of an output voltage (hereinafter it is also referred to as "an output wave form") to be provided to external devices connected to an output terminal of the output buffer circuit.

First embodiment

Figure 1:
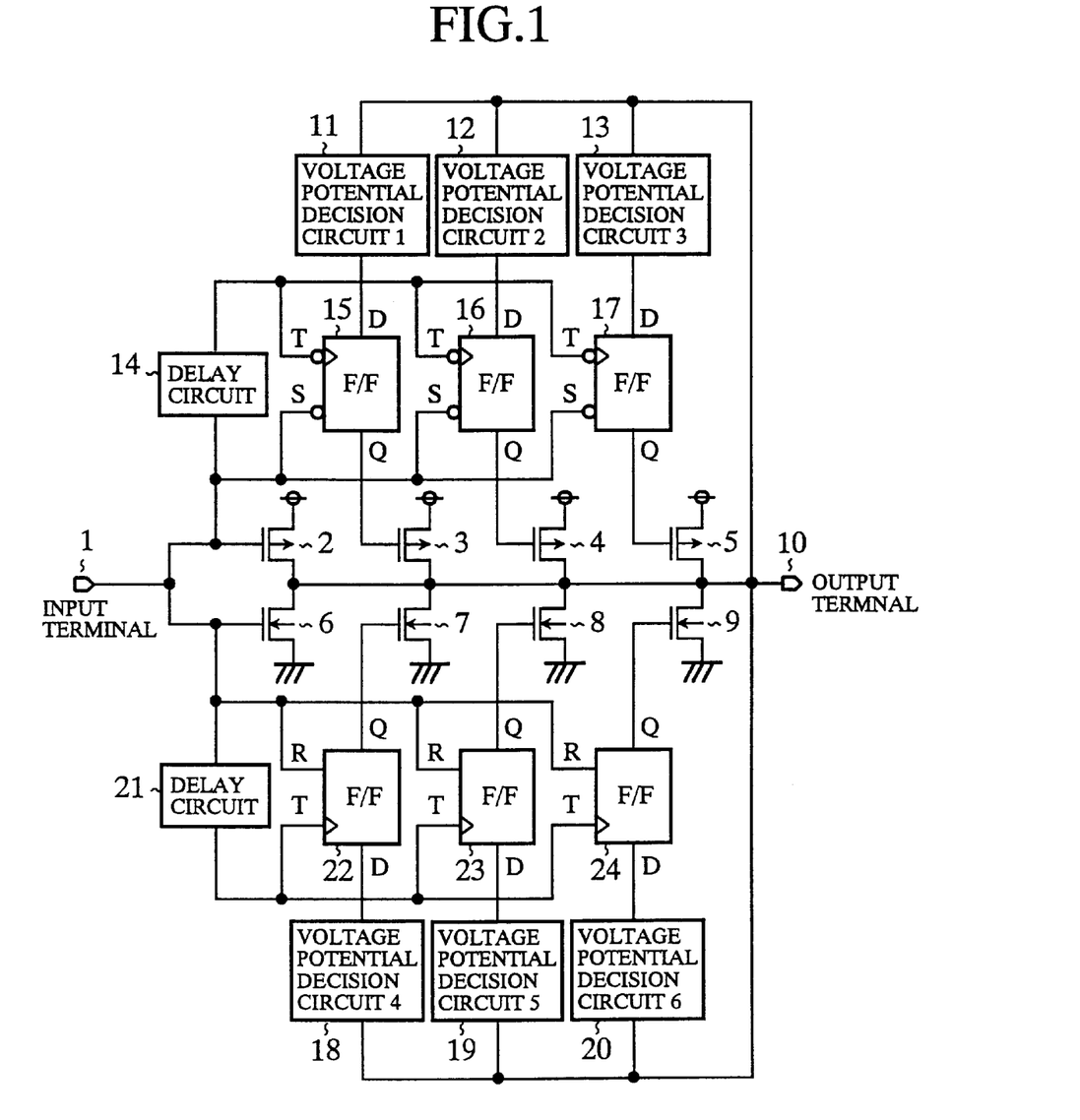
FIG. 1 is a block diagram showing a configuration of an output buffer circuit as the first embodiment according to the present invention.

FIG. 1 is a block diagram showing the configuration of the output buffer circuit as the first embodiment according to the present invention. In FIG. 1, the reference number 1 designates an input terminal for receiving an input signal, 2 to 5 denote high level (H level) voltage output transistors, and 6 to 9 indicate low level (L level) voltage output transistors. The reference numbers 11 to 13 designate voltage potential decision circuits for detecting the level of a voltage potential at an output terminal 10 and for outputting control signals in order to control an output voltage of H level from each of the H level voltage output transistors 3 to 5. The reference number 14 denotes a signal delay circuit to be used for the H level voltage output. The reference numbers 15 to 17 indicate flip flop (F/F) circuits with asynchronous set function. The reference numbers 18 to 20 denote voltage decision circuits for detecting the level of a voltage potential at the output terminal 10 and for outputting control signals in order to control an output voltage of the L level from each of the L level voltage output transistors 7 to 9. The reference number 21 denotes a signal delay circuit to be used for the output voltage of the L level. The reference numbers 22 to 24 indicate flip flop (F/F) circuits with synchronous reset function. The reference number 10 designates the output terminal. In the configuration of the output buffer circuit as the first embodiment described above, the voltage potential decision circuits 11 to 13 for the H level output voltage and the voltage potential decision circuits 18 to 20 for the L level output voltage have different voltage levels as decision standard voltages to each other that have been set in advance. For example, the value 0.5 V is set into the voltage potential decision circuit 11 for the H level output voltage, 0.7 V is set into the voltage potential decision circuit 12 for the H level output voltage, and 1.3 V is set into the voltage potential decision circuit 13 for the H level output voltage. These set values may be changed for various applications. Similarly, it is possible to set different levels as decision standard voltages into each of the voltage potential decision circuits 18 to 20 for the L level output voltage.

When the level of the input voltage potential, namely, the voltage potential at the output terminal 10, detected by each of the voltage potential decision circuits 11 to 13 and 18 to 20 is over the level of the decision standard voltage set in each of the voltage potential decision circuits 11 to 13 and 18 to 20, each of the voltage potential decision circuits 11 to 13 and 18 to 20 output a H level control signal to the corresponding flip flops 15 to 17 with the asynchronous set function, and when it is lower than that, each outputs a L level control signal to the corresponding flip flops 22 to 24 with the asynchronous reset function. Thereby, it is possible to control the operation of each of the output transistors 3 to 5 for the H level output voltage and the output transistors 7 to 9 for the L level output voltage.

In the output buffer circuit of the first embodiment shown in FIG. 1, the voltage potential decision circuits 11 to 13 and 18 to 20 both for the H level output voltage and for the L level output voltage detect the voltage potential at the output terminal 10 and compare the detected level of the voltage potential with the standard voltage values that have been set in each voltage potential decision circuit and output the comparison results to the flip flops 15 to 17 and 22 to 24. In this situation, when receiving an input signal through the input terminal 1, the delay circuits 14 and 21 output a trigger signal to the corresponding flip flop circuits 15 to 17 and 22 to 24. Thereby, when receiving the trigger signal from the delay circuits 14 and 21, the flip flop circuits 15 to 17 and 22 to 24 input the comparison results from the voltage potential decision circuits 11 to 13 and 18 to 20. According to the received comparison results, the flip flops 15 to 17 and 22 to 24 control the operation of the voltage output transistors 3 to 5 and 7 to 9, respectively. The outputs from the voltage output transistors 2 to 5 and 6 to 9 are provided to the output terminal 10. Thereby, the output buffer circuit as the first embodiment may control the through rate of the output wave form of the output voltage through the output terminal 10 at a constant rate even if the influence of the change of ambient temperature occurs and even if the change of the total load capacity of external devices connected to the output terminal 10 is caused.

Next, a description will be given of the operation of the output buffer circuit as the first embodiment.

When the output buffer circuit shown in FIG. 1 outputs the H level voltage output signal to external devices (not shown) through the output terminal 10, firstly, the control signal such as the L level is supplied to the input terminal 1. Thus, the H level voltage output transistor 2 turns ON immediately following the level of the input terminal 1 is changed from the H level to the L level. At the same time, the resetting operation for the flip flop circuits 22 to 24 with asynchronous reset function is executed and the L level voltage output transistors 6 to 9 turn OFF. Following this, the signal delay circuit 14 for the H level output voltage generates and transmits the trigger signal to the flip flops 15 to 17 with asynchronous set function after an elapse of a predetermined time period (for example, two nano seconds later, namely, after an elapse of 2.0 $E^{-9}$ seconds, as shown in FIG. 4) counted after the H level voltage output transistor 2 tuns ON based on the delay time data that has been set in the signal delay circuit 14.

The flip flops 15 to 17 with asynchronous set function input the voltage information about the level of the output voltage potential from each of the voltage potential decision circuits 11 to 13 when receiving the trigger signal from the signal delay circuit 14. Then, each of the flip flop circuits 15 to 17 outputs a control signal to the corresponding H level voltage output transistors 3 to 5 based on the voltage information in order to control the operation of them.

Next, the operation of the output buffer circuit of the first embodiment will be further explained in detail referring to the FIG. 4.

FIG. 4 is the diagram showing the wave forms of the output voltages from the output buffer circuit as the first embodiment shown in FIG. 1. In FIG. 4, the horizontal axis is a time (nano seconds) and a vertical axis is a voltage (Volts). FIG. 4 shows the output wave forms of the output voltages from the output buffer circuit as the first embodiment for four cases in which the total load capacity is 5 pF, 10 pF, 15 pF, and 20 pF, respectively. The dotted lines E to H show the output wave forms of the output voltage from the conventional output buffer circuit shown in FIG. 5 that has already been explained in the PRIOR ART SECTION. The solid lines A to D show the output wave forms of the output voltages provided from of the output buffer circuit as the first embodiment according to the present invention. In FIG. 4, the reference character I designates a timing at which each of the flip flops 15 to 17 for the H level output voltage inputs the decision result provided from each of the voltage potential decision circuits 11 to 13 for the H level output voltage. The reference characters J to L denote the decision standard voltage levels 0.5V, 0.7V, and 1.3V set in the output voltage decision circuits 11 to 13, respectively.

The wave form A is the output wave form of the output voltage from the output buffer circuit when the smallest load capacity 5 pF in the four load capacities is connected to the output terminal 10. Because the level of the output wave form of the output voltage is over all of the standard voltage levels 0.5V, 0.7V, and 1.3V at the timing I that have been set in the voltage decision circuits 11 to 13, each of the flip flop circuits 15 to 17 with asynchronous set function inputs the H level control signal as the decision result of the voltage decision circuits 11 to 13. Accordingly, the H level voltage output transistors 3 to 5 maintain the OFF state.

The wave form B is the wave form of the output voltage provided from the output buffer circuit when the load capacity 10 pF, that is twice of the load capacity 5 pF corresponding to the wave form A, is connected to the output terminal 10. Because the level of the voltage potential at the output terminal 10 is between the voltage level J (1.3V) and the voltage level K (0.7V) at the timing I, the flip flop circuit 15 with asynchronous set function inputs the L level control signal as the decision result of the voltage decision circuit 11 and each of the flip flop circuits 16 and 17 with asynchronous set function inputs the H level control signal as the decision result of the voltage decision circuits 12 and 13. Accordingly, the H level voltage output transistors 2 to 3 turn ON (become active) and other H level voltage output transistors 4 and 5 maintain the OFF state (keep inactive state). Thereby, the output buffer circuit of the first embodiment may output the wave form of the H level output voltage at the same constant through rate that is equal to the case of the wave form A.

Similarly, the output buffer circuit of the first embodiment may output the output wave form of the H level at the same constant through rate even if the load capacitance of 15 pF (in the case C that is three times of the case of the wave form A) or 20 pF (in the case D that is four times of the case of the wave form A) is connected to the output terminal 10.

That is, in the case C (its load capacitance is 15 pF), the wave form C is the wave form of the output voltage provided from the output buffer circuit when the load capacity 15 pF, that is three times of the load capacity 5 pF in the wave form A, is connected to the output terminal 10. Because the level of the voltage potential at the output terminal 10 is between the level K (0.7V) and the level L (0.5V) at the timing I, the flip flop circuits 15 and 16 with asynchronous set function input the L level control signal as the decision result of the voltage decision circuits 11 and 12 and the flip flop circuit 17 with asynchronous set function inputs the H level control signal as the decision result of the voltage decision circuit 13. Accordingly, the H level voltage output transistors 2 to 4 turn ON (as active state) and other H level voltage output transistor 5 maintains the OFF state (as inactive state). Thereby, the output buffer circuit of the first embodiment may output the wave form of the output voltage of the H level at the same constant through rate that is equal to the cases of the wave forms A and B.

In the case D, the wave form D is the output wave form from the output buffer circuit when the load capacity 20 pF, that is four times of the load capacity 5 pF of the wave form A, is connected to the output terminal 10. Because the level of the voltage potential at the output terminal 10 is lower than the level J (1.3V), the level K (0.7V), and the level L (0.5V) at the timing I, the flip flop circuits 15 and 17 with asynchronous set function input the L level control signal as the decision result of the voltage decision circuits 11 to 13. Accordingly, the H level voltage output transistors 2 to 5 turn ON (become active). Thereby, the output buffer circuit of the first embodiment may output the wave form of the output voltage of the H level at the same constant through rate that is equal to the cases of the wave forms A, B, and C.

Although the above explanation describes the cases in which the output terminal 10 outputs the wave forms of the output voltages only of the H level, it is possible to output wave forms of the output voltages of the L level by using the same manner.

When the input terminal 1 inputs the H level control signal, the L level voltage output transistors 6 to 9, the voltage decision circuits 18 to 20 for the L level output voltage, the signal delay circuit 21 for the L level output voltage, and the flip flop circuits 22 to 24 with asynchronous reset function operate the same manner described above. Thereby, the output buffer circuit may output the wave form of the output voltage of the L level at the same constant through rate. Therefore, the detailed explanation for various cases of the output wave forms of the output voltages of the L level is omitted here for brevity.

In addition, in the above explanation for the first embodiment, the number of the voltage potential decision circuits 11 to 13 for the H level output voltage, the voltage potential decision circuits 18 to 20 for the L level output voltage, the flip flops 15 to 17 with asynchronous set function, the flip flops 22 to 24 with asynchronous reset function is three, respectively. However, the present invention is not limited by this case, namely, the present invention may be applied to various cases in which the number of elements is more than one.

As described above, according to the output buffer circuit of the first embodiment, after one output transistor 2 or 6 turns ON according to the level of the input control signal received through the input terminal 1 and after the elapse of a predetermined time period that has been set in advance in the signal delay circuits 14, 21, each of the flip flop circuits 15 to 17 with asynchronous set function and each of the flip flop circuits 22 to 24 with asynchronous reset function inputs the decision result provided from each of the voltage potential decision circuits 11 to 13 and 18 to 20 according to the information about the voltage potential at the output terminal 10. Thereby, it is possible to keep the through rate of the wave form of the output voltage at a constant rate even if the total load capacity of external devices connected to the output terminal 10 is changed and even if the transistor characteristics of each of the output transistors 2 to 9 are changed according to the fluctuation of ambient temperature.

Second embodiment

Figure 2:
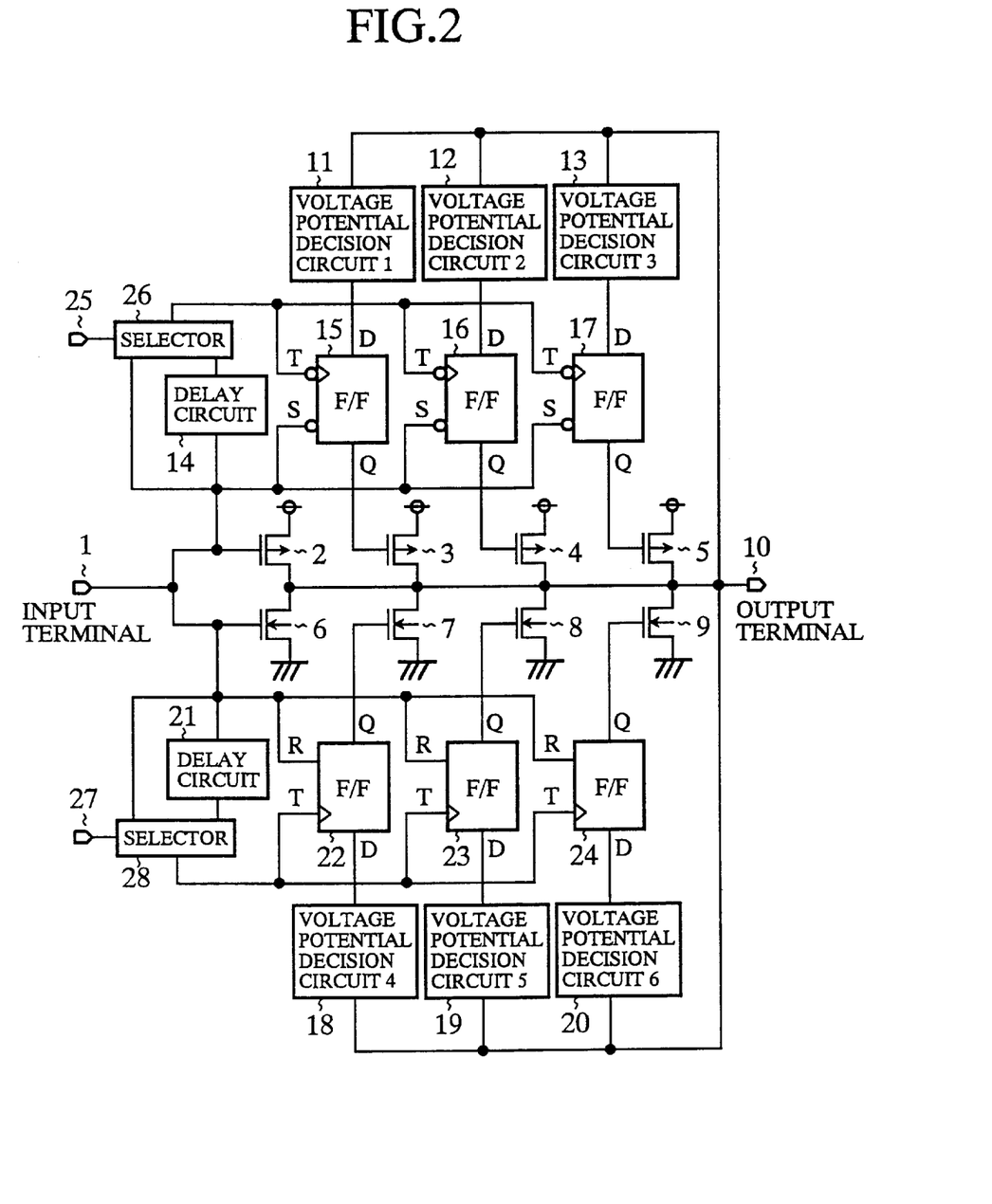
FIG. 2 is a block diagram showing a configuration of an output buffer circuit as the second embodiment according to the present invention.

FIG. 2 is a block diagram showing the configuration of an output buffer circuit as the second embodiment according to the present invention. In FIG. 2, the reference number 26 designates a switching selector for the H level output voltage, and 25 denotes a selection signal input terminal connected to the switching selector 26 for providing the received selection signal to the switching selector 26. The reference number 28 designates a switching selector for the L level output voltage, and 27 denotes a selection signal input terminal connected to the switching selector 28 for providing the received selection signal to the switching selector 28. Other components in the output buffer circuit as the second embodiment are the same as those of the output buffer circuit as the first embodiment shown in FIG. 1, therefore the same reference numbers are used for them and the explanation of them is omitted here for brevity.

In the output buffer circuit of the second embodiment, the selection signal provided from an external device (not shown) through the selection signal input terminals 25 and 27, and the operation of the switching selectors 26 and 28 is controlled based on the received selection signal in order to select whether the controlling of the through rate of the output buffer circuit is performed or not.

Next, a description will be given of the operation of the output buffer circuit of the second embodiment.

In the output buffer circuit as the first embodiment described above, at the timing I, the flip flop circuits 15 to 17 for asynchronous set function input the decision results from the voltage potential decision circuits 11 to 13 at the timing I. In the output buffer circuit of the second embodiment, by using the switching selector 26, this timing I may be shifted to the time at which the input terminal 1 receives the input control signal or to the time after the elapse of the delay time that has been set in the signal delay circuit 14 to output an wave form of an output voltage of the H level. For example, by incorporating the selector 26 in the output buffer circuit, when this timing I is set to the former case where the flip flops 15 to 17 input the decision results from the voltage potential decision circuits 11 to 13 by receiving the trigger signal from the selector 26 (whose operation is controlled by receiving the selection signal through the selection signal input terminal 25) immediately following the input terminal 1 receives the input control signal, the output terminal 10 may output the H level voltage having an output wave form to external devices connected to the output terminal 10 immediately following when the input terminal 1 inputs the H level control signal without any delay time. That is, because all of the voltage potential decision circuits 11 to 13 output the L level control signal to the flip flops 15 to 17 in this case, all of the H level voltage output transistors 3 to 5 immediately turn ON and the H level output voltage is output through the output terminal 10 to the external devices. This means there is no control to the through rate, namely, the control to the through rate of the wave form of the output voltage as the output signal becomes the inactive state. In this case, the explanation to output the H level signal through the output terminal 10 has already been described. The same manner may be applied in order to output the L level wave form of the output voltage to the external devices (not shown) through the output terminal 10.

That is, in the output buffer circuit of the second embodiment, by using the switching selector 28, the timing I may be shifted to the time at which the input terminal 1 receives the input control signal or shifted to the time after the elapse of the delay time that has been set in the signal delay circuit 21 to output the wave form of an output voltage of the L level. For example, by incorporating the selector 28 in the output buffer circuit, when this timing I is set to the former case where the flip flops 22 to 24 input the decision results from the voltage potential decision circuits 18 to 20 by receiving the trigger signal from the selector 28 (whose operation is controlled by receiving the selection signal through the selection signal input terminal 27) immediately following the input terminal 1 receives the input control signal, the output terminal 10 may output the L level voltage having an output wave form to the external devices (not shown) connected to the output terminal 10 immediately following when the input terminal 1 inputs the L level control signal without any delay time. That is, because all of the voltage potential decision circuits 22 to 24 output the L level control signal to the flip flops 22 to 24 in this case, and then all of the L level voltage output transistors 7 to 9 immediately turn ON and the wave form of the output voltage of the L level is output through the output terminal 10 to the external devices (not shown). This also means there is no control to the through rate, namely, the controlling to the through rate of the wave form of the output voltage ( or the output signal) becomes non-active state.

In the output buffer circuit of the second embodiment, in order to set the control of the through rate into the active state, namely, in order to operate the control to the through rate, the same manner of the first embodiment may be used. That is, the selection signal indicating to perform the control of the through rate is provided to the selection signal input terminal 25, and then the timing I at which the flip flops 15 to 17 with asynchronous set function input the decision results from the voltage potential decision circuits 11 to 13 is shifted to the time after the elapse of the delay time, that has been set in the signal delay circuit 14, in order to output a signal wave form of the output voltage of the H level. In addition, the selection signal indicating the use of the through rate function is also provided to the selection signal input terminal 27, and then the timing I at which the flip flops 22 to 24 with asynchronous set function input the decision results from the voltage potential decision circuits 18 to 20 is shifted to the time after the elapse of the delay time, that has been set in the signal delay circuit 21, in order to output a signal wave form of the output voltage of the L level. Following operation is the same as that of the output buffer circuit as the first embodiment, therefore the explanation of the operation is omitted here.

As described above, according to the second embodiment, by incorporating the switching selector 26 for the H level output voltage signal and the switching selector 28 for the L level output voltage signal in the output buffer circuit, it is possible to select whether the control for the through rate is performed (becomes active) or not (becomes inactive). Thereby, it is possible to select whether the control to the through rate of the output buffer circuit is executed or not according to applications.

Third embodiment

Figure 3:
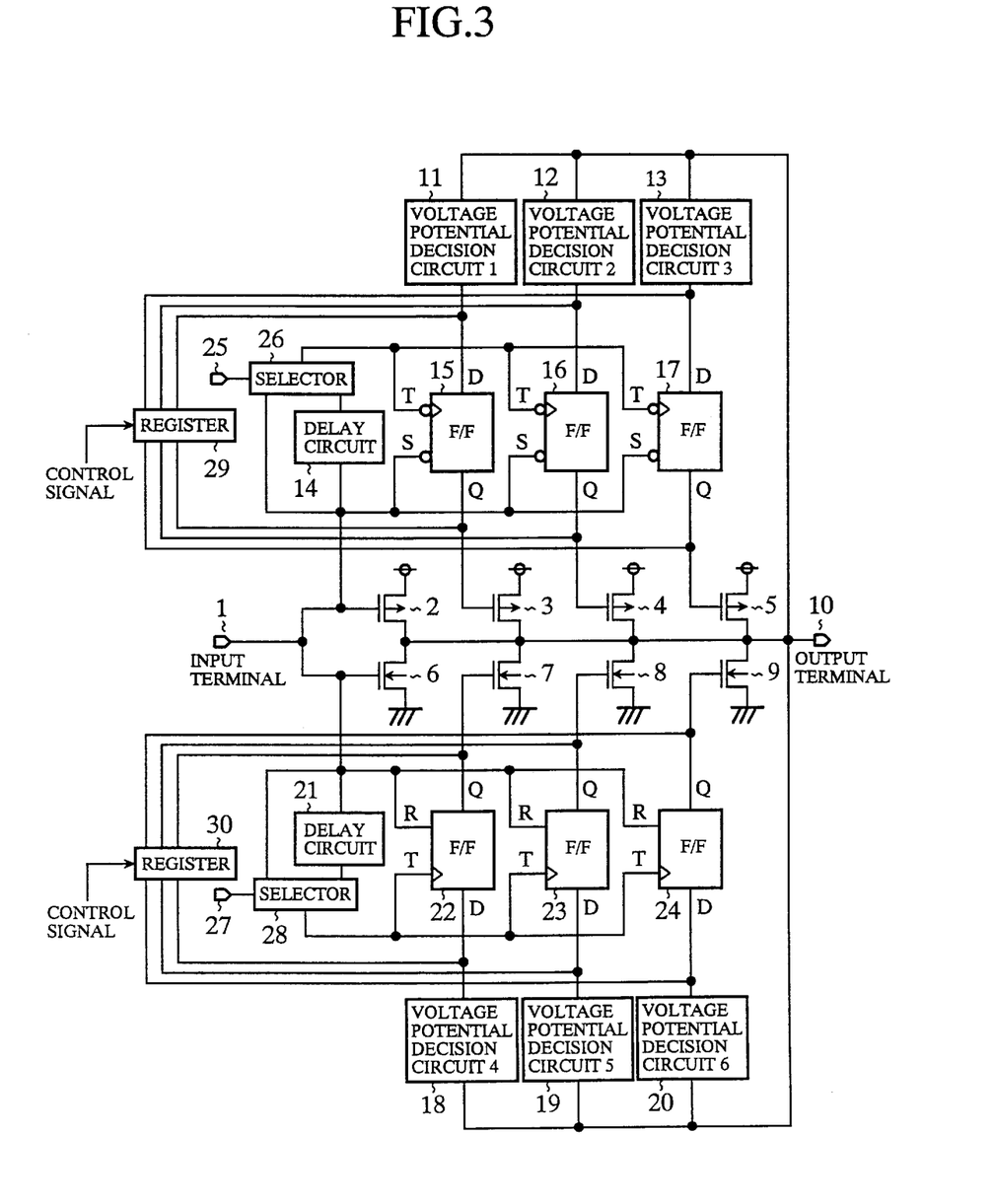
FIG. 3 is a block diagram showing a configuration of an output buffer circuit as the third embodiment according to the present invention.

FIG. 3 is a block diagram showing the configuration of the output buffer circuit as the third embodiment according to the present invention. In FIG. 3, the reference number 29 designates a register to store the decision result of the voltage potential decision circuits 11 to 13 for the H level output voltage, and 30 denotes a register to store the decision result of the voltage potential decision circuits 18 to 20 for the L level output voltage. Other components in the output buffer circuit as the third embodiment are the same as those of the output buffer circuit as the second embodiment shown in FIG. 2, therefore the same reference numbers are used for them and the explanation of them is omitted here for brevity.

Next, a description will be given of the operation of the output buffer circuit of the third embodiment.

Under the condition in which the selection signal indicating to perform the control for the through rate is provided to the selection signal input terminal 25 and the timing I at which each of the flip flops 15 to 17 with asynchronous set function inputs the decision result from each of the corresponding voltage potential decision circuits 11 to 13 is shifted to the time after the elapse of the delay time set in the signal delay circuit 14 in order to output an output signal wave form of the output voltage of the H level, the output terminal 10 outputs the H level output voltage. At this time, the decision results of the voltage potential decision circuits 11 to 13 are stored into the register 29 according to an instruction signal transferred from a central processing unit (not shown) or other external control units, for example.

Next, when the output buffer circuit of the third embodiment outputs the H level output signal, the timing I at which the flip flops 15 to 17 input the decision results stored in the register 29 is set to the time immediately following when the input terminal 1 inputs the control signal. Thereby, the preceding decision results that have been stored in the register 29 are transferred to the flip flops 15 to 17 immediately following when the input terminal 1 receives the input signal. When comparing in operation speed with the output buffer circuits of the first embodiment and the second embodiment where the output transistors operate after the elapse of the delay time set in the delay circuit 14, it is possible to operate the output transistors 2 to 5 in the output buffer circuit of the third embodiment at a higher speed rate.

Although the above explanation has described only that the output terminal 10 outputs the H level voltage signal, it is possible to output the L level output signal by using the same manner. That is, under the condition in which the selection signal indicating to execute the control to the through rate is provided to the selection signal input terminal 27 and the timing I at which each of the flip flops 22 to 24 with asynchronous set function inputs the decision result from each of the corresponding voltage potential decision circuits 18 to 20 is shifted to the time after the elapse of the delay time set in the signal delay circuit 21 in order to output a signal wave form of the output voltage of the L level, the output terminal 10 outputs the L level output voltage. At this time, the decision results of the voltage potential decision circuits 18 to 20 are stored into the register 30 according to an instruction signal transferred from a central processing unit (not shown), for example.

Next, when the output buffer circuit outputs the L level output signal, the timing I at which each of the flip flops 22 to 24 inputs the decision results stored in the register 30 is set to the time immediately following when the input terminal 1 inputs the control signal. Thereby, the decision results stored in the register 30 are transferred to the flip flops 22 to 24 immediately following when the input terminal 1 receives the input signal. When comparing in operation speed with the output buffer circuits as the first embodiment and the second embodiment where the output transistors operate after the elapse of the delay time set in the delay circuit 21, it is also possible to operate the output transistors 6 to 9 in the output buffer circuit of the third embodiment at a high speed rate.

As described above, according to the third embodiment, by incorporating the register 29 for storing the decision results of the voltage potential decision circuits 11 to 13 for the H level output voltage and the register 30 for storing the decision results of the voltage potential decision circuits 18 to 20 for the L level output voltage in the output buffer circuit, the preceding decision results are stored into the registers 29 and 30, and the flip flops 15 to 17 and 22 to 24 immediately read the decision results stored in the registers 29 and 30 in the following operation. Thereby, it is possible to increase the operation speed of the output buffer circuit because the decision operation by the voltage potential decision circuits may be omitted.

As described above, according to the present invention, the output buffer circuit capable of controlling a through rate of the wave form of an output voltage provided from an output terminal at a constant rate has a configuration in which each of a plurality of voltage potential decision means inputs information about a voltage potential at said output terminal, compares said voltage potential with a value of a predetermined standard voltage and outputs a decision result, each of a plurality of delay means outputs a trigger signal after an elapse of a predetermined time period counted from an input terminal receives a control signal provided externally, a plurality of output means provide an output voltage to said output terminal, and each of a plurality of control means inputs said decision results from each of said plurality of voltage potential decision means and operates said plurality of output means according to said decision results when said plurality of control means receive said trigger signal transferred from said delay means. Thereby, it is possible to control the through rate of the output buffer circuit by performing a feed back operation of information about the voltage potential at the output terminal after the elapse of the predetermined time period and to keep a constant through rate even if the total load capacity of external devices connected to the output terminal is changed and even if the transistor characteristics of said plurality of output means caused by the fluctuation of ambient temperature are changed.

In addition, according to the present invention, in the output buffer circuit capable of controlling a through rate, said plurality of output means comprise a plurality of H level voltage output transistors and a plurality of L level voltage output transistors, said plurality of voltage potential decision means comprise a plurality of voltage decision circuits for the H level output voltage and a plurality of voltage decision circuits for the L level output voltage, said control means comprises a plurality of flip flop circuits with asynchronous set function and a plurality of flip flop circuits with asynchronous reset function, said plurality of delay means comprises a signal delay circuit for the H level output voltage and a signal delay circuit for the L level output voltage, and wherein said plurality of H level voltage output transistors may output the output wave form of the H level voltage according to the operation of said plurality of voltage potential decision circuits for the H level output voltage, said plurality of flip flop circuits with asynchronous set function and said delay circuit for the H level output voltage, and wherein said plurality of L level voltage output transistors may output the output wave form of the L level output voltage according to the operation of said plurality of voltage potential decision circuits for the L level output voltage, said plurality of flip flop circuits with asynchronous reset function and said delay circuit for the L level output voltage. Thereby, it is also possible to control the through rate of the output buffer circuit by performing a feed back operation of the information about the voltage at the output terminal after the elapse of the predetermined time period and to keep a constant through rate even if the total load capacity of external devices connected to the output terminal is changed and even if the transistor characteristics of said plurality of output means caused by the fluctuation of ambient temperature are changed.

Furthermore, according to the present invention, the output buffer circuit further comprises switching means for selecting one of the plurality of output means, namely, said plurality of control means input said decision results from said plurality of voltage potential decision means when said plurality of control means receive said trigger signal from said plurality of delay means and said plurality of control means input said decision results from said plurality of voltage potential decision means when said input terminal inputs said control signal. Thereby, it is possible to select whether the control operation for the through rate of the wave form of the output voltage becomes active or inactive according to various applications.

Moreover, according to the present invention, the output buffer circuit capable of controlling a through rate, the output buffer circuit further comprises a plurality of storing means for temporarily storing said plurality of decision results from said plurality of voltage potential decision means, and wherein said plurality of control means control said operation of said plurality of output means based on said plurality of decision results stored in said plurality of storing means. Thereby, it is possible to immediately control the operation of the output transistors by reading the preceding decision results that have been stored in the storing means before the completion of the decision operation performed by the plurality of voltage potential decision means. This causes to increase the operation speed of the output buffer circuit.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. An output buffer circuit capable of controlling a through rate of an output wave form of an output voltage potential provided from an output terminal at a constant rate, comprising:

a plurality of voltage potential decision means, each voltage potential decision means for receiving information about the output voltage potential at said output terminal, for comparing said output voltage potential with a respective predetermined standard value, and for outputting a respective decision result;

a plurality of delay means, each delay means for outputting a respective trigger signal after a respective predetermined time period is elapsed from when an input terminal receives a control signal;

a plurality of output means for providing an output voltage potential to said output terminal; and a plurality of control means for inputting said respective decision results from said plurality of voltage potential decision means and for operating said plurality of output means according to said respective decision results when said plurality of control means receive said respective trigger signal transferred from said plurality of delay means.

2. The output buffer circuit capable of controlling a through rate as claimed in claim 1, wherein said plurality of output means comprises a plurality of H level voltage output transistors and a plurality of L level voltage output transistors, said plurality of voltage potential decision means comprises a plurality of voltage decision circuits for H level output voltage and a plurality of voltage decision circuits for L level output voltage, said plurality of control means comprises a plurality of flip flop circuits with asynchronous set function and a plurality of flip flop circuits with asynchronous reset function, said plurality of delay means comprises a signal delay circuit for the H level output voltage and a signal delay circuit for the L level output voltage, and wherein said plurality of H level voltage output transistors output the output wave form of the H level output voltage according to the operation of said plurality of voltage potential decision circuits for the H level output voltage, said plurality of flip flop circuits with asynchronous set functions and said delay circuit for the H level output voltage, and wherein said plurality of L level voltage output transistors output the output wave form of the L level output voltage according to the operation of said plurality of voltage potential decision circuits for the L level output voltage, said plurality of flip flop circuits with asynchronous reset function and said delay circuit for the L level output voltage.

3. The output buffer circuit capable of controlling a through rate as claimed in claim 1, further comprises switching means for selecting one of the plurality of output means, said plurality of control means input said respective decision results from said plurality of voltage potential decision means when said plurality of control means receive said respective trigger signal from said plurality of delay means and said plurality of control means input said respective decision results from said plurality of voltage potential decision means when said input terminal inputs said control signal.

4. The output buffer circuit capable of controlling a through rate as claimed in claim 2, further comprises switching means for selecting one of the plurality of output means, said plurality of control means input said respective decision results from said plurality of voltage potential decision means when said plurality of control means receive said respective trigger signal from said plurality of delay means and said plurality of control means input said respective decision results from said plurality of voltage potential decision means when said input terminal inputs said control signal.

5. The output buffer circuit capable of controlling a through rate as claimed in claim 1, further comprises a plurality of storing means for temporarily storing said respective decision results from said plurality of voltage potential decision means, and wherein said plurality of control means control said operation of said plurality of output means based on said respective decision results stored in said plurality of storing means.

6. The output buffer circuit capable of controlling a through rate as claimed in claim 2, further comprises a plurality of storing means for temporarily storing said respective decision results from said plurality of voltage potential decision means, and wherein said plurality of control means control said operation of said plurality of output means based on said respective decision results stored in said plurality of storing means.

7. The output buffer circuit capable of controlling a through rate as claimed in claim 3, further comprises a plurality of storing means for temporarily storing said respective decision results from said plurality of voltage potential decision means, and wherein said plurality of control means control said operation of said plurality of output means based on said respective decision results stored in said plurality of storing means.

8. The output buffer circuit capable of controlling a through rate as claimed in claim 4, further comprises a plurality of storing means for temporarily storing said respective decision results from said plurality of voltage potential decision means, and wherein said plurality of control means control said operation of said plurality of output means based on said respective decision results stored in said plurality of storing means.

9. The output buffer circuit capable of controlling a through rate as claimed in claim 3, wherein said switching means comprises selectors.

10. The output buffer circuit capable of controlling a through rate as claimed in claim 4, wherein said switching means comprises selectors.

11. The output buffer circuit capable of controlling a through rate as claimed in claim 5, wherein a said plurality of storing means comprises registers.

* * * * *